(12) United States Patent
Kim et al.

(10) Patent No.: US 11,869,839 B2
(45) Date of Patent: Jan. 9, 2024

(54) PACKAGE PANEL PROCESSING WITH INTEGRATED CERAMIC ISOLATION

(71) Applicant: TEXAS INSTRUMENTS INCORPORATED, Dallas, TX (US)

(72) Inventors: Woochan Kim, Sunnyvale, CA (US); Benjamin Allen Samples, Albany, OR (US); Vivek Kishorechand Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 219 days.

(21) Appl. No.: 17/317,873

(22) Filed: May 11, 2021

(65) Prior Publication Data
US 2021/0280512 A1 Sep. 9, 2021

Related U.S. Application Data

(62) Division of application No. 16/263,110, filed on Jan. 31, 2019, now Pat. No. 11,031,332.

(51) Int. Cl.
| | |
|---|---|
| *H01L 23/522* | (2006.01) |
| *H01L 23/538* | (2006.01) |
| *H01L 23/532* | (2006.01) |
| *H01L 25/07* | (2006.01) |
| *H01L 49/02* | (2006.01) |
| *H01L 23/00* | (2006.01) |
| *H01L 25/00* | (2006.01) |

(52) U.S. Cl.
CPC ...... *H01L 23/5226* (2013.01); *H01L 23/5383* (2013.01); *H01L 23/5386* (2013.01); *H01L 23/5389* (2013.01); *H01L 23/53228* (2013.01); *H01L 24/09* (2013.01); *H01L 25/072* (2013.01); *H01L 25/50* (2013.01); *H01L 28/40* (2013.01); *H01L 2224/0231* (2013.01); *H01L 2224/02373* (2013.01); *H01L 2224/02381* (2013.01)

(58) Field of Classification Search
CPC .......... H01L 23/5226; H01L 23/53228; H01L 23/5383; H01L 23/5386; H01L 23/5389; H01L 24/09; H01L 25/072; H01L 25/50; H01L 28/40; H01L 2224/0231; H01L 2224/02373; H01L 2224/02381
See application file for complete search history.

(56) References Cited

U.S. PATENT DOCUMENTS

| | | | |
|---|---|---|---|
| 8,450,151 B1 | 5/2013 | Poddar et al. | |
| 8,716,830 B2 | 5/2014 | Poddar et al. | |
| 9,099,454 B2 | 8/2015 | Wachter et al. | |
| 9,663,357 B2 | 5/2017 | Mao et al. | |
| 10,256,217 B2 | 4/2019 | Lee et al. | |
| 11,031,332 B2 * | 6/2021 | Kim | H01L 25/50 |
| 2010/0116325 A1 | 5/2010 | Nikoonahad | |
| 2010/0237511 A1 | 9/2010 | Masumoto | |

(Continued)

*Primary Examiner* — Fernando L Toledo
*Assistant Examiner* — Neil R Prasad
(74) *Attorney, Agent, or Firm* — Ronald O. Neerings; Frank D. Cimino

(57) ABSTRACT

A packaged electronic device includes a semiconductor die with an electronic component and a contact structure connected to the electronic component, as well as an organic panel frame, a lamination structure that partially embeds the semiconductor die in an opening of the organic panel frame, and a ceramic substrate mounted to a first side of the semiconductor die.

20 Claims, 16 Drawing Sheets

(56) References Cited

U.S. PATENT DOCUMENTS

| | | |
|---|---|---|
| 2013/0052777 A1 | 2/2013 | Xu et al. |
| 2013/0082383 A1 | 4/2013 | Aoyo |
| 2013/0093067 A1 | 4/2013 | Clark et al. |
| 2013/0154088 A1 | 6/2013 | Cable et al. |
| 2013/0244382 A1 | 9/2013 | Clark |
| 2014/0342136 A1 | 11/2014 | Nagao et al. |
| 2015/0003000 A1 | 1/2015 | Manepalli et al. |
| 2015/0008566 A1 | 1/2015 | Gerber et al. |
| 2015/0143690 A1 | 5/2015 | Poddar |
| 2015/0147845 A1 | 5/2015 | Podder et al. |
| 2016/0005705 A1 | 1/2016 | Masumoto |
| 2020/0168552 A1 | 5/2020 | Ha et al. |

* cited by examiner

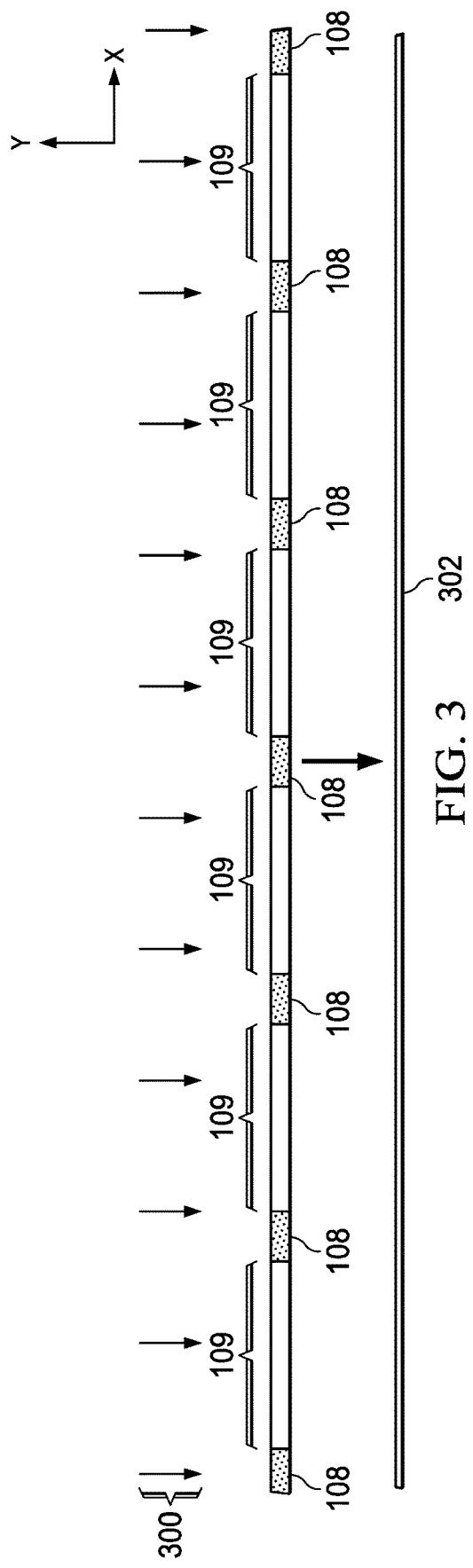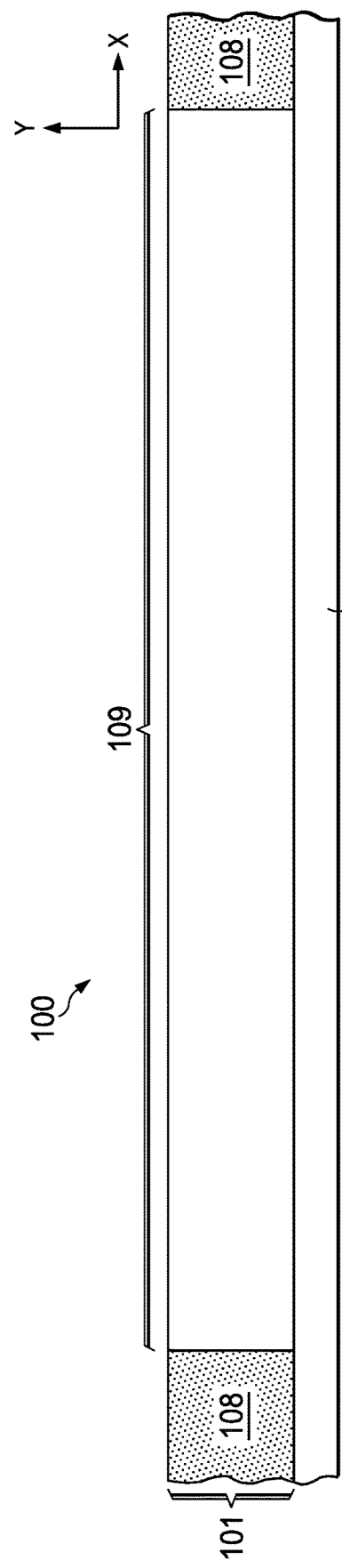

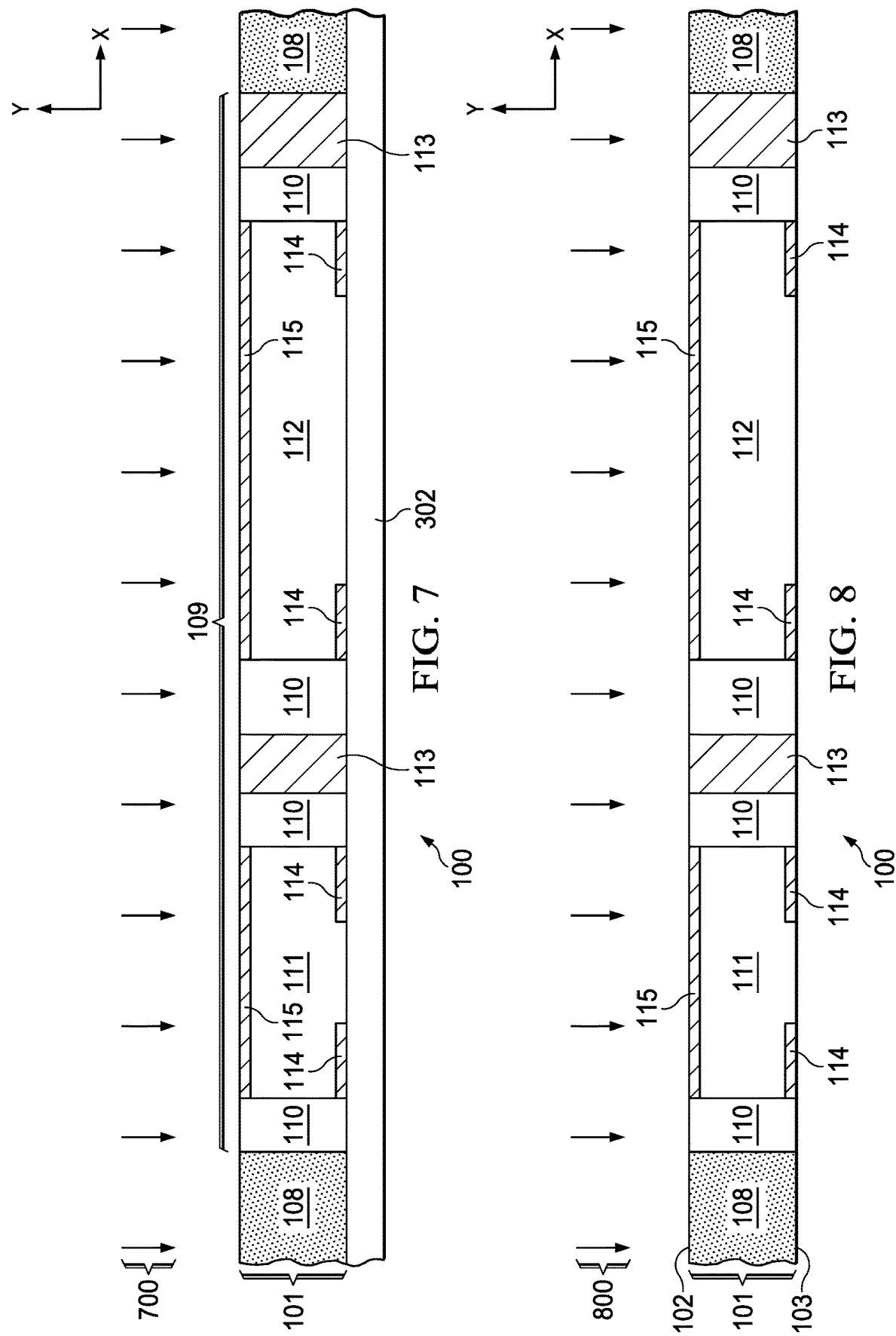

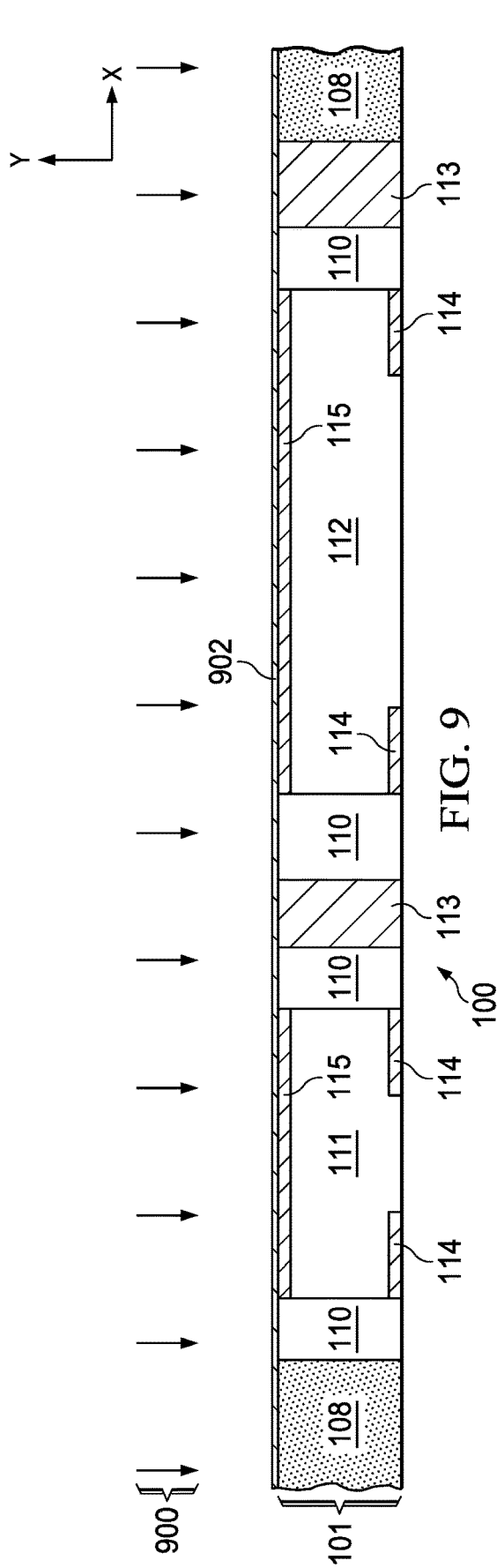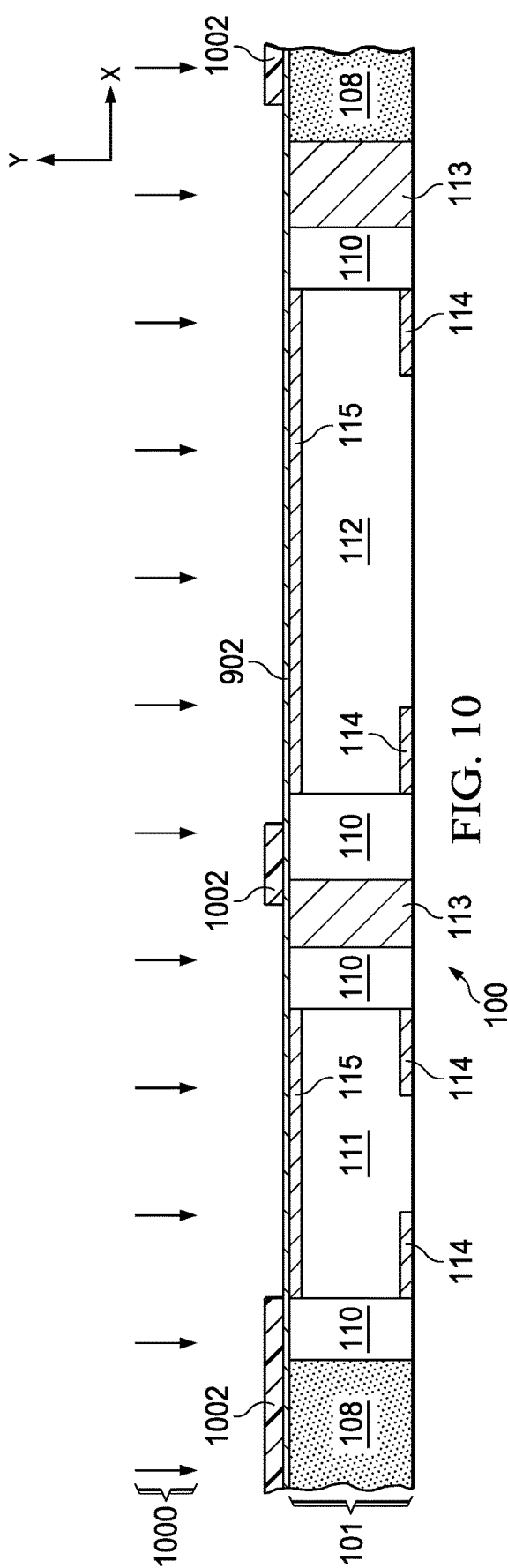

PACKAGE PANEL PROCESSING WITH INTEGRATED CERAMIC ISOLATION

CROSS-REFERENCE TO RELATED APPLICATION

This application is a Divisional of application Ser. No. 16/263,110 filed Jan. 31, 2019, which is related to co-pending and co-assigned patent application Ser. No. 16/132,906, entitled "EMBEDDED DIE PACKAGING WITH INTEGRATED CERAMIC SUBSTRATE", filed on Sep. 17, 2018, the entirety of which is hereby incorporated by reference.

BACKGROUND

Embedded die packaging is used to integrate semiconductor dies with one another and/or with one or more passive components in a variety of applications, such as load power supplies, switching regulators, automotive systems, and mobile communications devices. Certain applications use high-voltage transistors, such as gallium nitride (GaN) or silicon carbide (SiC) devices, which can be integrated in embedded die package products. High voltage circuits are often designed to meet high voltage withstanding ratings, functional isolation performance metrics, and minimum creepage distance specifications. These requirements can increase embedded package size, due to materials used in panel processing that have poor electrical isolation properties, where increased voltage withstand performance is achieved by thicker material cross section or increasing creepage distances. However, modern product designs have limited size restrictions, and reduced circuit and system sizes are desired.

SUMMARY

Described examples include a packaged electronic device with a semiconductor die having an electronic component and a contact structure connected to the electronic component. The packaged device also includes an organic panel frame, a lamination structure that embeds the die in an opening of the organic panel frame, and a ceramic substrate mounted to the semiconductor die. Disclosed examples provide a solution to poor voltage withstand performance of organic panel frames through integration of the ceramic substrate into the panel processed package. Described examples further facilitate thermal die cooling. In some examples, the packaged electronic device also includes a single or multi-layer redistribution layer (RDL) structure with a conductive structure electrically connected to the semiconductor die contact. The packaged electronic device in one example also includes a passive component attached to the RDL structure, and the passive component is electrically connected to the RDL conductive structure. In one example, the packaged electronic device includes a circuit, such as a half bridge circuit, formed by first and second transistor components of the semiconductor die, and the RDL structure includes a conductive structure in a return path of the circuit. The ceramic substrate in one example includes a first side with a first conductive layer soldered to the first side of the embedded die structure, as well as a second side with a second conductive layer, and a conductive via that extends through the ceramic substrate from the first side to the second side to electrically connect the first conductive layer to the second conductive layer. In one example, the first conductive layer, and the second conductive layer of the ceramic substrate are in the return path of the circuit.

Described examples further include a method for fabricating a packaged electronic device. The method includes attaching an organic panel frame to an adhesive carrier structure, attaching a plurality of semiconductor dies to the adhesive carrier structure in openings of the organic panel frame, forming a lamination structure in gaps between the organic panel frame and the semiconductor dies, and removing the adhesive carrier structure. The method also includes forming a redistribution layer (RDL) structure with a conductive structure electrically connected to contact structures of the semiconductor dies, attaching a ceramic substrate to the semiconductor dies, and separating a packaged electronic device from the panel. One example includes soldering a first conductive layer on a first side of the ceramic substrate to further contact structures of the semiconductor dies. Another example includes epoxying a first side of the ceramic substrate to the semiconductor dies. A further example includes sintering a first side of the ceramic substrate to the semiconductor dies.

BRIEF DESCRIPTION OF THE DRAWINGS

FIGS. 3-21 are partial sectional side elevation and top plan views of the packaged electronic device of FIG. 1 undergoing fabrication processing according to the method of FIG. 2.

DETAILED DESCRIPTION

Figure 1:
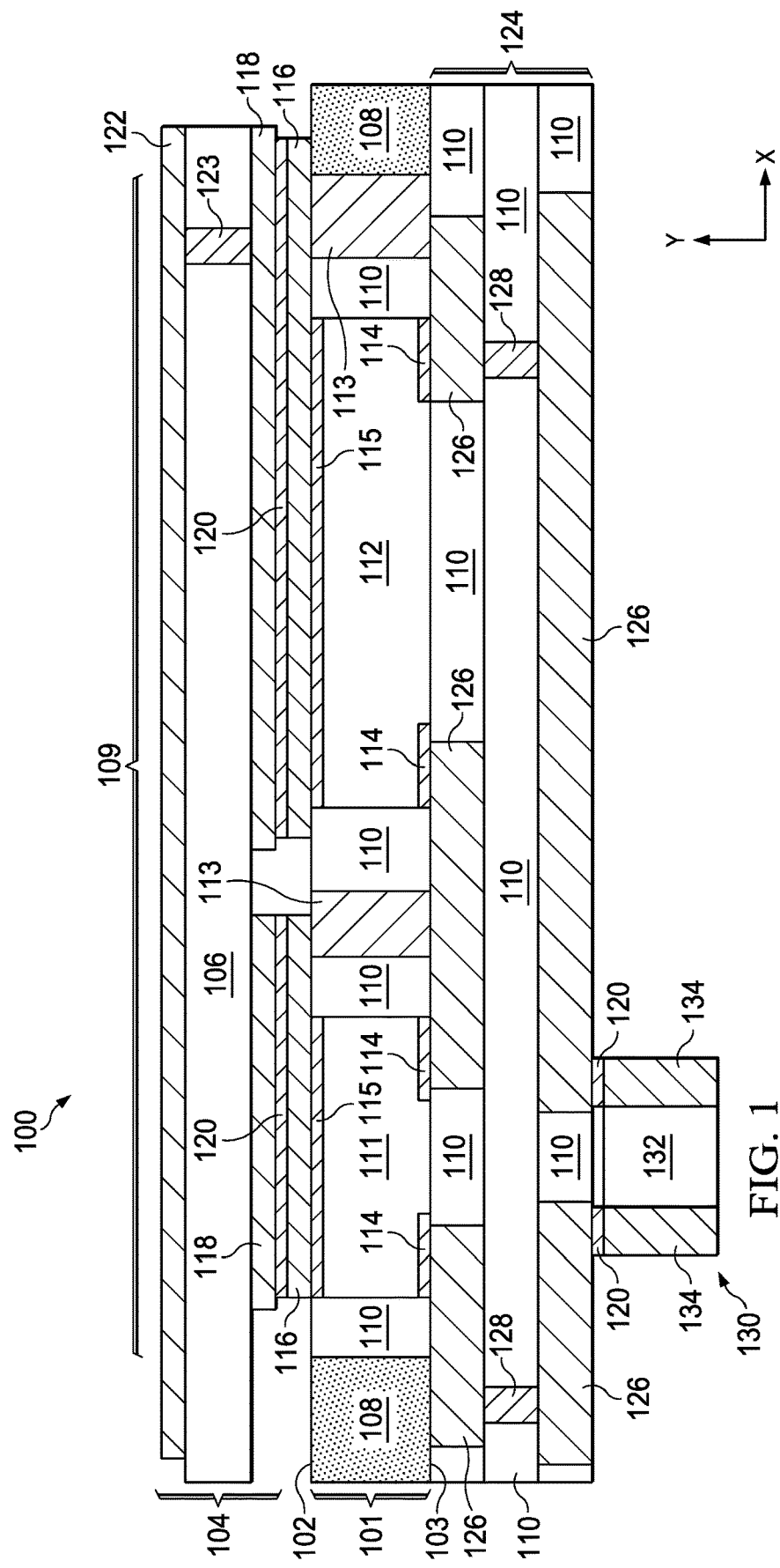
FIG. 1 is a partial sectional side elevation view of a packaged electronic device with a ceramic substrate to transfer heat from a tope side of first and second semiconductor dies embedded in an organic frame structure.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couple s to or is coupled with a second device, that connection may be through a direct electrical connection, or through an indirect electrical connection via one or more intervening devices and connections. The various features of the disclosed examples can be used in connection with a variety of different packaged electronic devices, including without limitation integrated circuits having multiple electronic components, as well as single component electronic devices (e.g., single transistor products, single diode products, etc.). The disclosed examples integrate functional isolation of a ceramic substrate for small package size with good voltage withstand performance and thermal die cooling, in combination with the low parasitic benefits and cost effectiveness of a panel processed organic frame.

FIG. 1 shows a packaged electronic device 100. The illustrated example is an integrated circuit (IC). The packaged electronic device 100 includes an embedded die structure 101 with a first (e.g., top) side 102 and a second (e.g., bottom) side 103. The packaged electronic device 100 also includes a ceramic isolation structure 104 mounted to the first side 102 of the embedded die structure 101. In the example of FIG. 1, a plated lower side of the ceramic isolation structure 104 is soldered to plated features on the first side 102 of the embedded die structure 101. In other examples, the ceramic isolation structure 104 is mounted to the first side 102 of the embedded die structure 101 by epoxy or sintering. The ceramic isolation structure 104 in one example include s a ceramic substrate 106 mounted to the first side 102 of the embedded die structure 101. The ceramic substrate 106 is or includes a ceramic material, meaning a solid material including an inorganic compound of metal, non-metal and/or metalloid atoms primarily held in ionic and covalent bonds. In one example, the ceramic isolation structure 104 includes aluminum oxide (e.g., $Al_2O_3$). In one example, the ceramic isolation structure 104 includes aluminum nitride (e.g., AN). In one example, the ceramic isolation structure 104 includes silicon nitride (e.g., $Si_3N_4$).

The embedded die structure 101 includes an organic panel frame 108 with an opening 109, and a lamination structure 110 that partially embeds semiconductor dies 111 and 112 in the opening 109. The panel frame 108 in one example is or includes an organic polymer. The panel frame 108 can be made of any organic material, meaning a material that includes organic matter, such as matter that has come from a once-living organism, is capable of decay or is the product of decay, or is composed of organic compounds, and/or an organic compound that contains carbon. The organic frame is a cost effective structure with low electrical parasitics, such as parasitic inductance and/or parasitic capacitance. The panel frame 108 begins as a large structure with openings 109 for large numbers of dies (e.g., several hundred dies) prior to product separation during fabrication. The lamination structure 110 in one example is or includes build-up material that begins as sheets that are pressed or otherwise installed into gaps between the organic panel frame 108 and the semiconductor dies 111 and 112. Technique is referred to as dry film lamination. In one example, the lamination structure 110 and the constituent buildup material sheets are or include an organic material.

Figure 22:
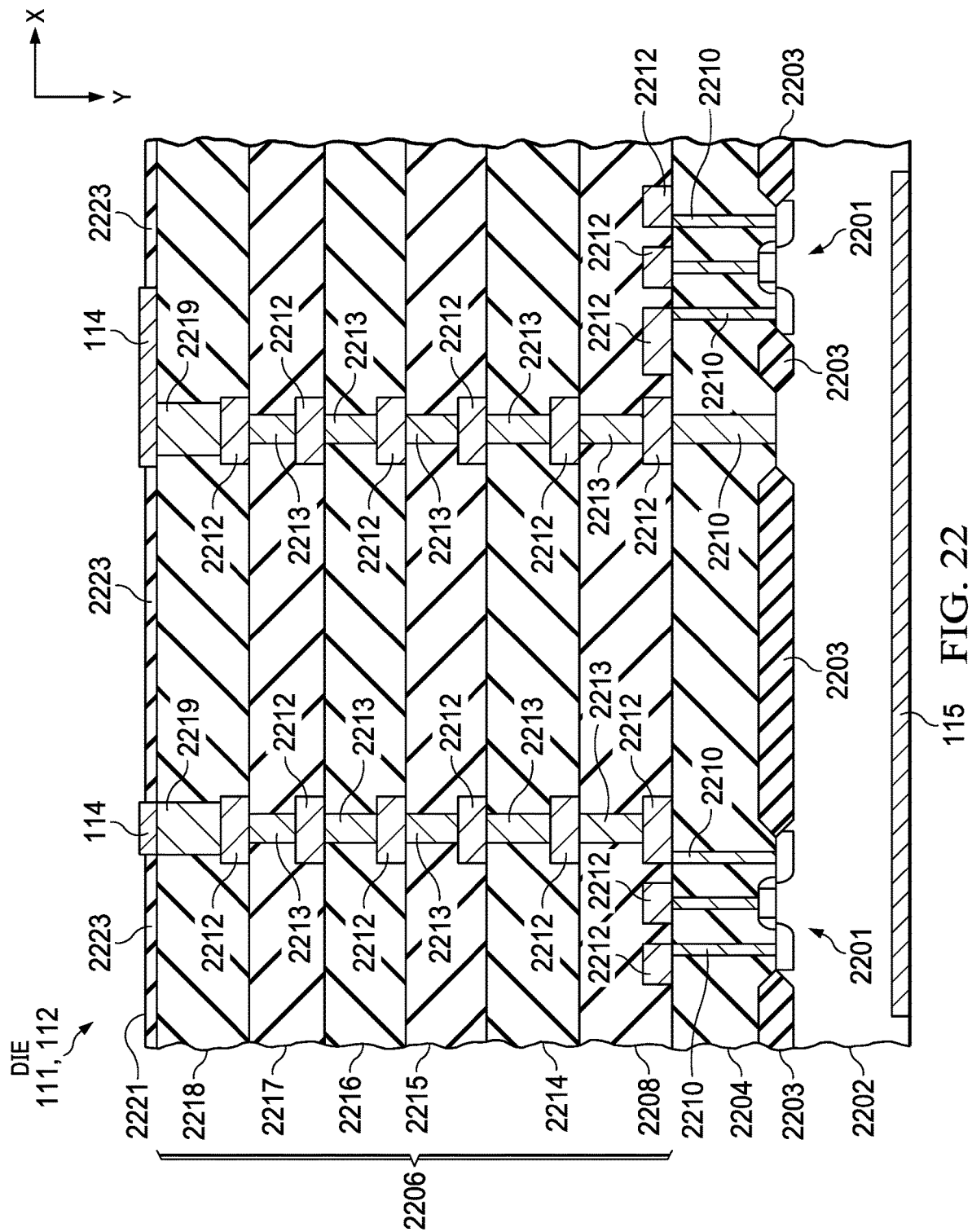
FIG. 22 is a partial sectional side elevation view of an example semiconductor die in the packaged microelectronic devices of FIG. 1.

The embedded die structure 101 in one example includes first and second semiconductor dies 111 and 112, respectively. In other examples, a single die or more than two dies can be used. The example dies 111 and 112 each include one or more electronic components, such as transistors (not shown). FIG. 22 below shows further details of an example semiconductor die 111, 112 that can be used in the embedded die structure 101. In one example, the individual dies 111 and 112 each include a single transistor component, such as a high voltage GaN or SiC transistor.

The example embedded die structure 101 in FIG. 1 includes conductive vias 113, such as plated copper, that extend from the first side 102 (e.g., top) to the second (e.g., bottom) side 103. In one example, a copper via 113 is formed through the lamination structure 110, laterally spaced from and between the first and second dies 111 and 112 of the embedded die structure 101. Another example conductive via 113 in FIG. 1 is laterally positioned between a portion of the lamination structure 110 and the organic panel frame 108.

The example dies 111 and 112 in FIG. 1 each include one or more lower contact structures 114, such as copper pads connected to the internal electronic component. In one example, the illustrated contact structures 114 are connected to source/drain features of the included transistor for each die 111, 112, and the packaged electronic device 100 includes a half bridge or other circuit formed by the first and second transistor components of the semiconductor dies 111 and 112. In the illustrated example, the contact structures 114 are generally flush with the second side 103 of the embedded die structure 101, and are generally flush with the bottom sides of the corresponding dies 111 and 112. In other examples, the contact structures 114 can extend outward from the bottom sides of the dies 111 and 112. The example dies 111 and 112 in this example also include upper conductive contact structures 115, such as plated copper.

In the example of FIG. 1, the embedded die structure 101 also includes plated copper structures 116 that extend on or over the first side 102 of the embedded die structure 101. The ceramic isolation structure 104 in this example includes first conductive layers 118, such as plated copper features 118 that extend on a first (e.g., bottom) side of the ceramic substrate 106 and generally correspond to the plated copper structures 116 on the first side 102 of the embedded die structure 101. In this example, the first conductive layers 118 of the ceramic isolation structure 104 are soldered to the first side 102 of the embedded die structure 101, e.g., soldered to the structures 116, via solder material 120 (e.g., tin-lead, lead-free solders, etc.). The ceramic substrate 106 in FIG. 1 also includes a second (e.g., top) side with a second conductive layer 122 (e.g., plated copper), that provides a ground plane or EMI shield in one implementation. In this example, the ceramic isolation structure 104 also includes a conductive via 123 that extends through the ceramic substrate 106 from the first side to the second side to electrically connect the first conductive layer 118 to the second conductive layer 122. In one example, the conductive via 123, the first conductive layer 118, and the second conductive layer 122 of the ceramic substrate 106 are in the return path of the circuit, to allow an end user to connect the second conductive layer 122 to a ground return of a power supply (not shown). The ceramic isolation structure 104 in this example provides an EMI shielding plane for electromagnetic shielding of a power supply or other circuit formed by the components of the semiconductor dies 111, 112, and also provides thermal cooling paths through the ceramic substrate 106 to facilitate cooling of the semiconductor dies 111 and 112 during operation of the power supply circuit.

The packaged electronic device 100 also includes a redistribution layer (RDL) structure 124 with conductive structures 126, 128 electrically connected to the contact structures 114 of the semiconductor dies 111 and 112. In the illustrated example, high and low side transistors of the first and second dies 111, 112 are connected by the RDL structure 124 into a half bridge configuration to implement a switching power supply, such as a buck converter, boost converter, etc. The RDL structure 124 can be constructed using any suitable metallization and interconnection materials and processes, such as direct bonded copper (DBC), active metal bonding (AMB), insulated metal substrate (IMS) processing, direct bonded aluminum (DBA), etc. The conductive structures can be metal lines 126 and/or vias 128 of any suitable electrically conductive material, such as Cu, Ni, Pd, Ag, Au.

The RDL structure 124 can be a single layer structure, or a multi-layer structure. The example RDL structure 124 in FIG. 1 includes three layers, each formed by fabricating plated conductive copper structures 126 and forming buildup material as lamination structures 110 in the gaps between the conductive copper structures 126. The illustrated RDL structure 124 is a multi-layer structure with a first layer that includes conductive structure 126 electrically connected to the contact structures 114 of the semiconductor dies 111, 112, an intervening middle layer with vias (copper structures) 128, as well as a final layer with further conductive structures 126 electrically connected to the contact structures 114 of the semiconductor dies 111, 112. Although the example of FIG. 1 includes multiple dies 111, 112, each having conductive contact structures 114 that are connected to the RDL structure 124, other examples can include a single die, and a single conductive contact structure 114 that is connected to conductive structures 126, 128 of the RDL structure 124.

The packaged electronic device 100 in FIG. 1 also includes a passive component 130 attached to the final layer of the RDL structure 124. The passive component 130 is electrically connected to the further conductive structures 126 of the final RDL layer. In one example, the passive component 130 is a capacitor, with a dielectric 132 and capacitor plates 134. The capacitor plates 134 in this example are soldered to corresponding conductive structures 126 of the final RDL layer using solder material 120. In other examples, more than one passive component are attached to the RDL structure 124. In various implementations, different types of passive components can be attached to the RDL structure 124, such as capacitors, resistors, inductors, diodes, etc.

In the example of FIG. 1, the return path of the half bridge or other circuit formed by the components of the semiconductor dies 111, 112 includes conductive structures 126, 128 of the RDL structure 124. In this example, the return path includes a ground connection capacitor component 130, which is electrically connected through corresponding metal lines 126 and a via 128 of the RDL structure 124, and includes a connection to one contact structure 114 of the second die 112, as well as to a conductive via 113 of the embedded die structure 101. The conductive metal layers 116 and 118 and the soldered connection there between provide electrical connection of the return path via 113 to the via 123 of the ceramic isolation structure 104, which connects the return path of the circuit to the second conductive layer 122. In this example, the conductive layer 122 provides a ground plane above the ceramic substrate 106, which provides EMI shielding for the dies 111 and 112 of the embedded die structure 101.

Figure 2:
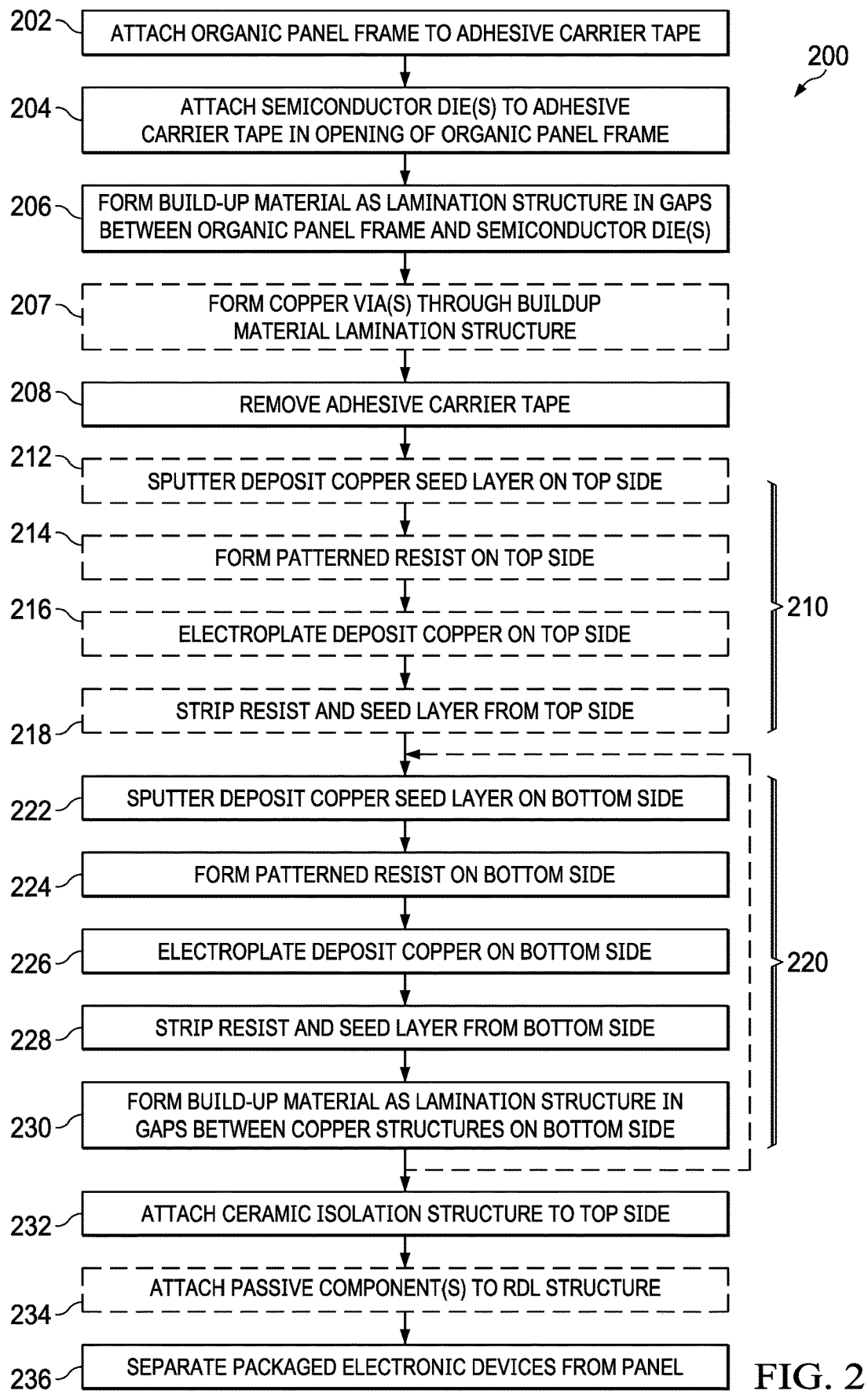
FIG. 2 is a flow diagram of a method of fabricating a packaged electronic device.

FIG. 2 shows a method 200 for fabricating a packaged electronic device. The method 200 can be used in one implementation to fabricate the device 100 described above. The example method 200 concurrently fabricates multiple packaged electronic devices in a panelized batch process, with individual packaged electronic devices being separated after or near the end of the process. FIGS. 3-21 show the example packaged electronic device 100 of FIG. 1 undergoing fabrication processing according to the method 200. The initial processing at 202, 204, 206, 207 and 208 in FIG. 2 form the embedded die structure 101.

The method 200 includes attaching an organic panel frame to an adhesive carrier structure at 202. The example panel frame 108 begins as a large structure depicted in FIG. 3 with openings 109 for potentially large numbers of dies, and individual packaged products are ultimately separated from the panel structure after various fabrication processes. FIGS. 3 and 4 show one example, in which an attachment process 300 is performed that attaches an organic panel frame 108 to a conductive adhesive tape (referred to as tacky tape) 302. In one example, the organic panel frame 108 is pressed onto an adhesive side of the adhesive carrier structure 302 along the direction indicated in FIG. 3. FIG. 4 shows a smaller portion of the attached panel structure with the organic panel frame 108 attached to the underlying adhesive carrier structure 302.

Figure 5:
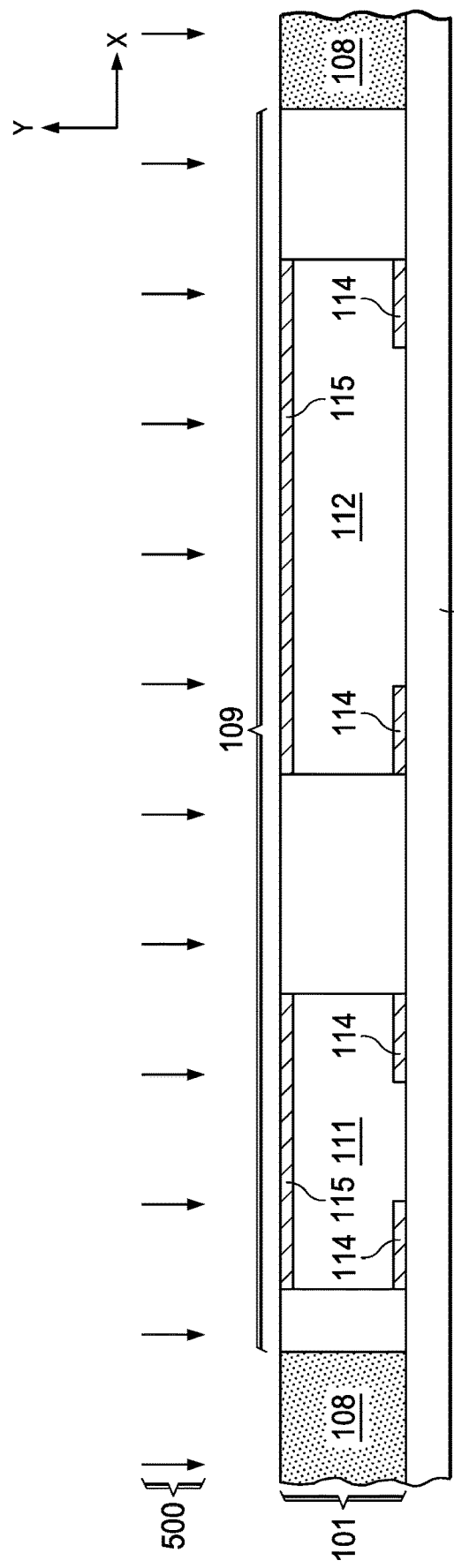

The method 200 continues at 204 in FIG. 2, with attaching one or more semiconductor dies to the adhesive carrier structure in openings of the organic panel frame. FIG. 5 shows one example, in which a mechanized attachment process 500 (e.g., a pick and place process) is performed that attaches the first and second semiconductor dies 111 and 112 to the adhesive carrier structure 302 within the opening 109 of the organic panel frame 108.

Figure 6:
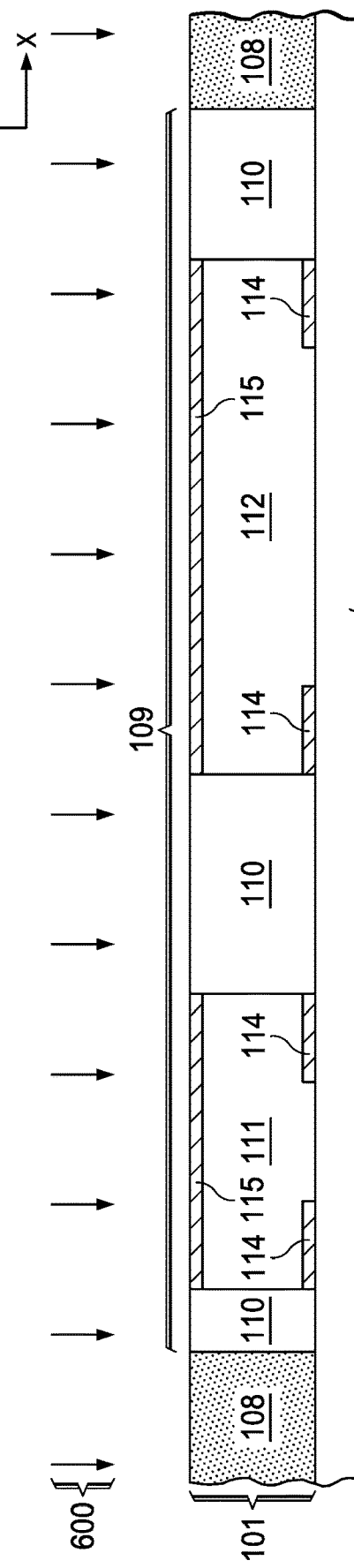

The method 200 continues at 206, including forming a lamination structure in gaps between the organic panel frame and the semiconductor die or dies. In one example, the lamination structure is created by forming buildup material in sheet form in the gaps. FIG. 6 shows one example, in which a process 600 is performed that forms the lamination structure 110 in the gaps between the organic panel frame 108 and the dies 111 and 112, including the illustrated gap between the first and second dies 111 and 112. The build-up material in one example begins as sheets, and the process 600 includes pressing or otherwise installing one or more sheets of the material into the gaps between the organic panel frame 108 and the semiconductor dies 111 and 112.

In one example, the method 200 also includes forming one or more conductive (e.g., copper) vias through the build-up material lamination structure at 207. FIG. 7 shows one example, in which a via formation process 700 forms the above-described conductive vias 113 through portions of the lamination structure 110. The example conductive vias 113 are formed using one or more processing steps to electroplate copper in openings (not shown) formed through the lamination structure 110. In this example, the conductive vias 113 extend from the first side 102 (e.g., top) to the second (e.g., bottom) side 103 of the embedded die structure 101. As shown in the example of FIG. 7, the process 700 forms a first conductive via 113 through the lamination structure 110 between the first and second dies 111 and 112, and a second conductive via 113 between a portion of the lamination structure 110 and the organic panel frame 108. In the illustrated device 100, the via formation at 207 facilitates forming and overlying ground plane/EMI shield 122 in FIG. 1 that is electrically connected to a return path of a circuit that include s components of the dies 111 and 112. In other implementations, the conductive via formation at 207 is omitted.

The method 200 continues at 208, including removing the adhesive carrier structure. FIG. 8 shows one example, in which a tape removal process 800 is performed that removes the adhesive carrier structure from the bottom side of the embedded die structure 101.

The process 200 in FIG. 2 includes forming patterned conductive structures at 210 on the first (e.g., top) side 102 of the embedded die structure 101. The fabrication at 210 in one example includes forming a seed layer on the first side 102 at 212. FIG. 9 shows one example, in which a sputter deposition process 900 is performed that deposits a copper seed layer 902 on the first side 102 of the embedded die structure 101. As shown in FIG. 9, the process 900 forms the seed layer 902 on the top sides of the organic panel frame 108, the lamination structure 110, the upper conductive features 115 of the dies 111 and 112, and on the top sides of the conductive vias structures 113.

At 214 in FIG. 2, the method 200 further includes forming a patterned resist on the first (e.g., top) side 102 of the embedded die structure 101 and the seed layer 902 thereof. FIG. 10 shows one example, in which a process 1000 is performed at deposits and patterns a resist material layer 1002 to cover select portions of the seed layer 902, and to leave exposed other portions of the seed layer 902.

Figure 11:
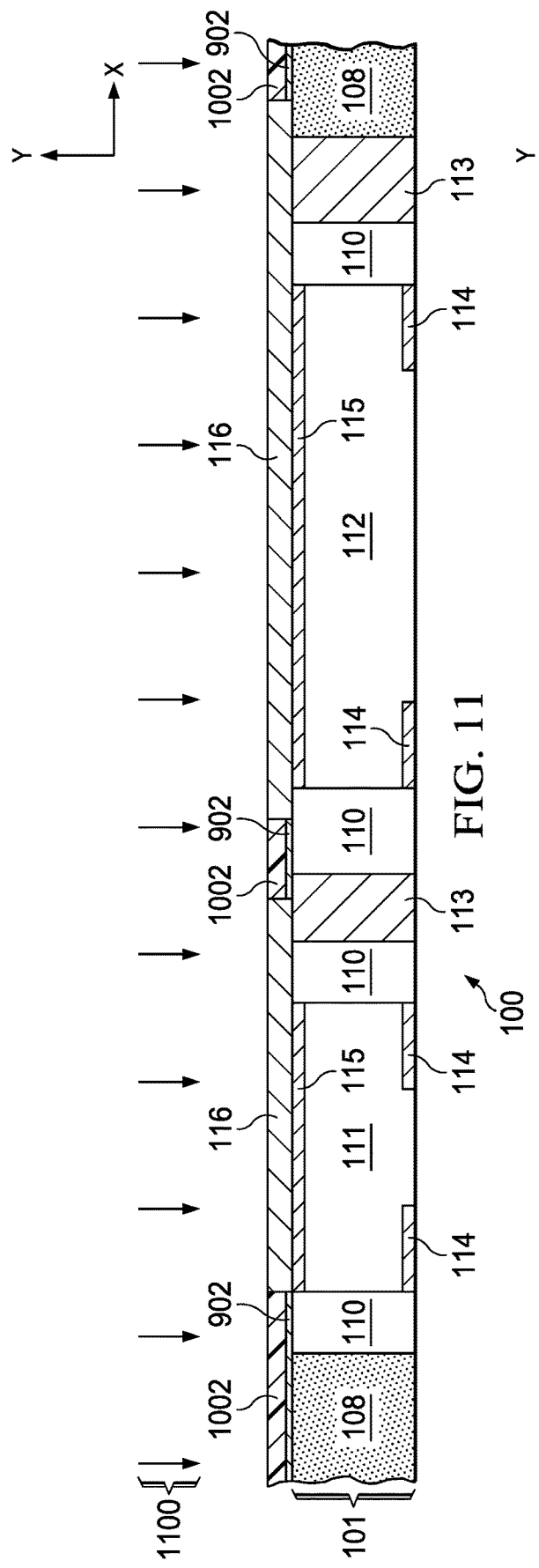

At 216 in FIG. 2, the method 200 further includes depositing conductive material on the first side 102 of the embedded die structure 101. FIG. 11 shows one example, in which a copper electroplating process 1100 is performed that deposits conductive copper material 116 over the exposed portions of the copper seed layer 902 within the openings of the patterned resist 1002.

Figure 12:
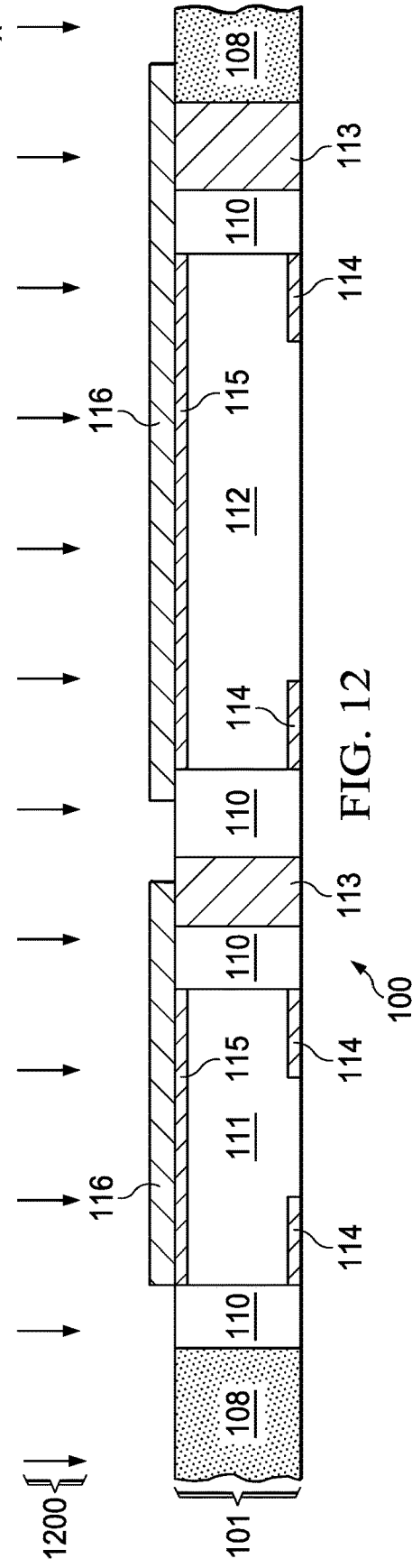

At 218 in FIG. 2, the method 200 continues with removal of the resist and underlying seed layer material from the top of the embedded die structure 101. FIG. 12 shows one example, in which a stripping process 1200 is performed that strips or otherwise removes the remaining resist material, along with underlying remnant portions of the seed layer. As shown in FIG. 12, the process 1200 leaves the plated copper structures 116 that extend on or over select portions of the first side 102 of the embedded die structure 101.

As discussed above in connection with the example of FIG. 1, the patterned plated copper structures 116 generally correspond to conductive structures of a subsequently attached ceramic isolation structure 104 to facilitate soldering of the ceramic isolation structure 104 to the first side 102 of the embedded die structure 101. In other examples, the conductive structure formation at 210 is omitted.

The method 200 in FIG. 2 continues at 220 with forming patterned conductive structures and lamination structures to form a single or multi-layer RDL structure on the second (e.g., bottom) side 103 of the embedded die structure 101. The example RDL fabrication processing for one RDL layer is illustrated in FIG. 2 at 222, 224, 226, 228 and 230, and examples are shown in FIGS. 13-18.

Figure 13:
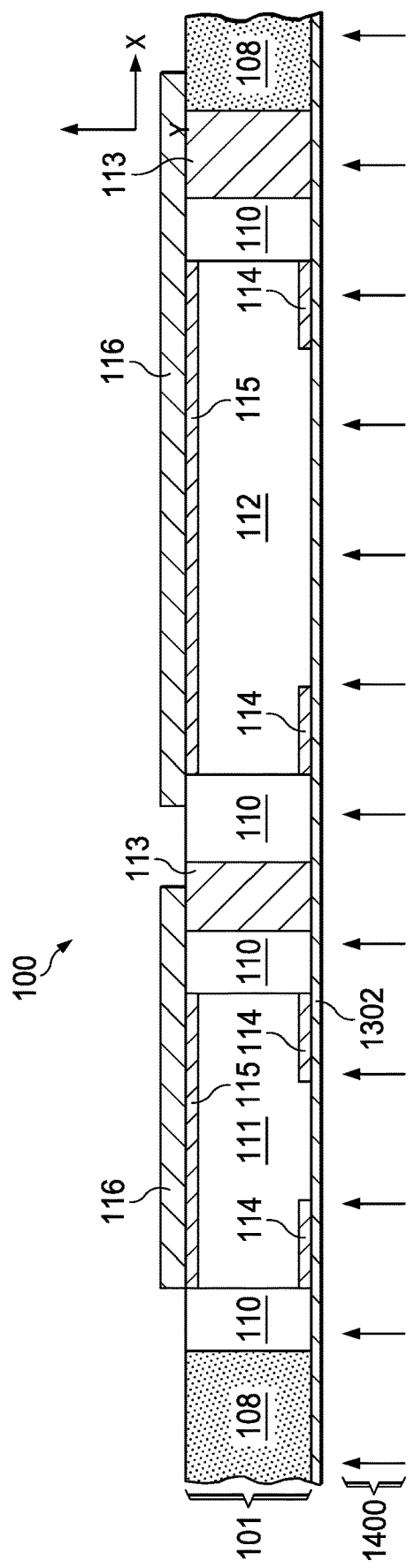

At 222, the RDL processing 220 includes forming a seed layer on the second (e.g., bottom) side 103 at 222. FIG. 13 shows one example, in which a sputter deposition process 1300 is performed that deposits a copper seed layer 1302 on the second side 103 of the embedded die structure 101. The example process 1300 forms the seed layer 1302 on the bottom sides of the organic panel frame 108, the lamination structure 110, the lower conductive features 114 of the dies 111 and 112, and on the bottom sides of the conductive vias structures 113 of the embedded die structure 101.

Figure 14:
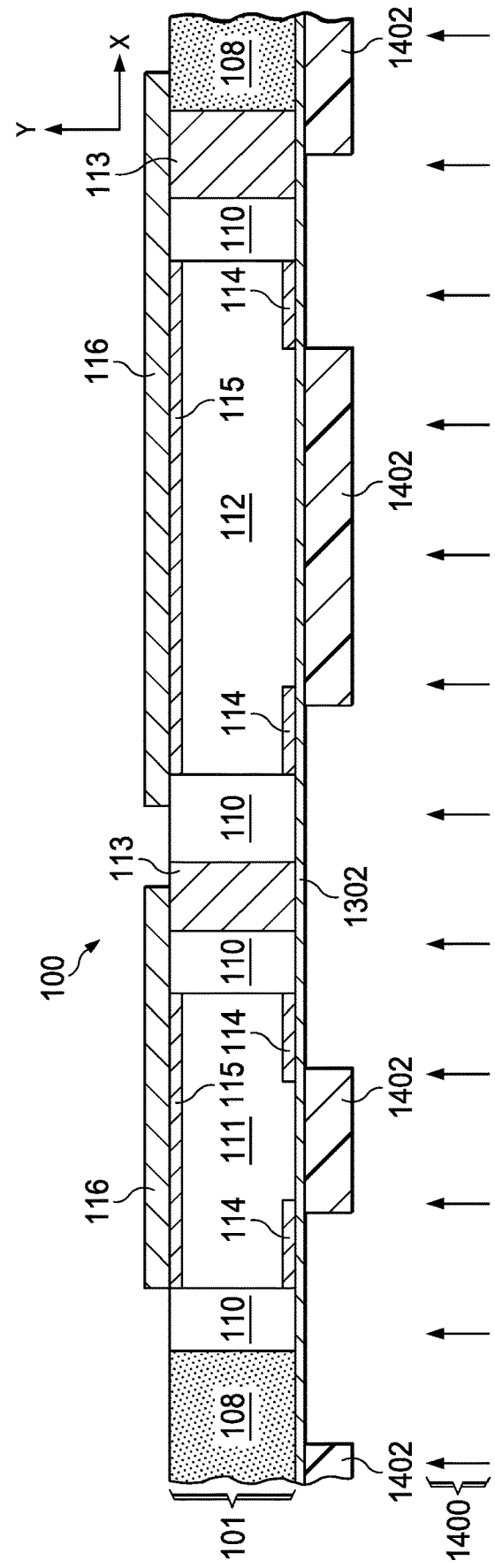

At 224 in FIG. 2, the method 200 further includes forming a patterned resist on the seed layer 1302 on the second (e.g., bottom) side 103 of the embedded die structure 101. FIG. 14 shows one example, in which a process 1400 is performed that deposits and patterns a resist material layer 1402 to cover select portions of the bottom side seed layer 1302, and that leaves other portions of the seed layer 1302 exposed.

Figure 15:
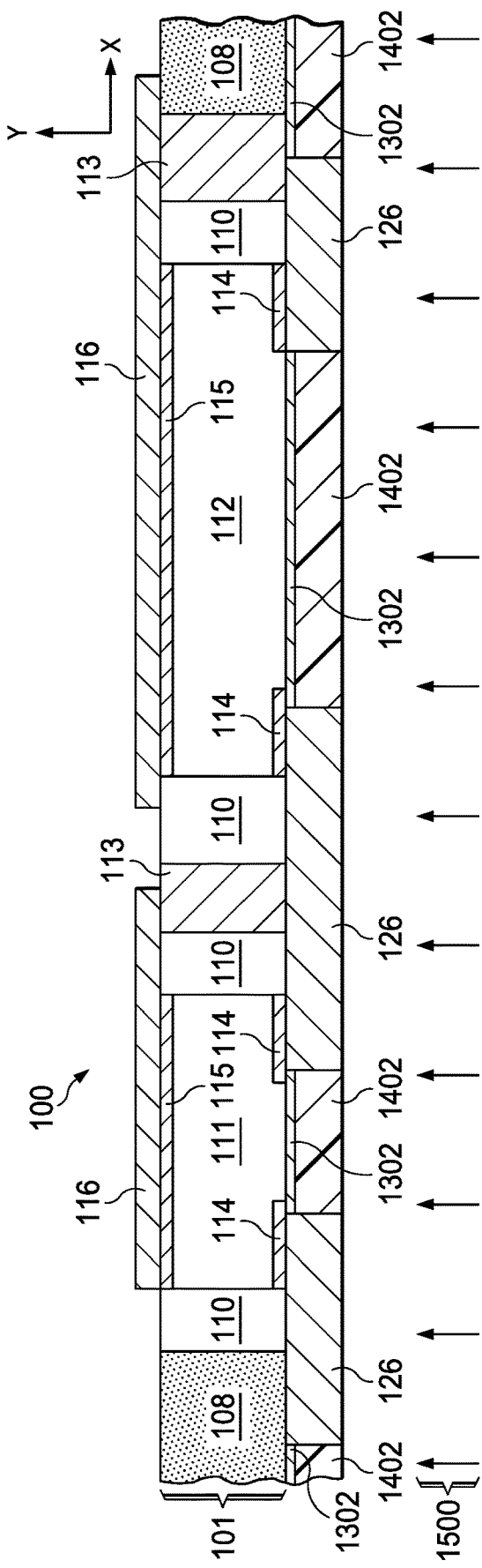

At 226 in FIG. 2, the method 200 further includes depositing conductive material on the second (e.g., bottom) side 103 of the embedded die structure 101. FIG. 15 shows one example, in which a copper electroplating process 1500 is performed that deposits conductive copper material 126 over the exposed portions of the copper seed layer 1302 within the openings of the patterned resist 1402. The resulting copper is shown as a single structure 126 between the patterned resist structures 1402 in FIG. 15 and subsequent figures including FIG. 1, which includes the associated portion of the original copper seed layer and the electroplated copper.

Figure 16:
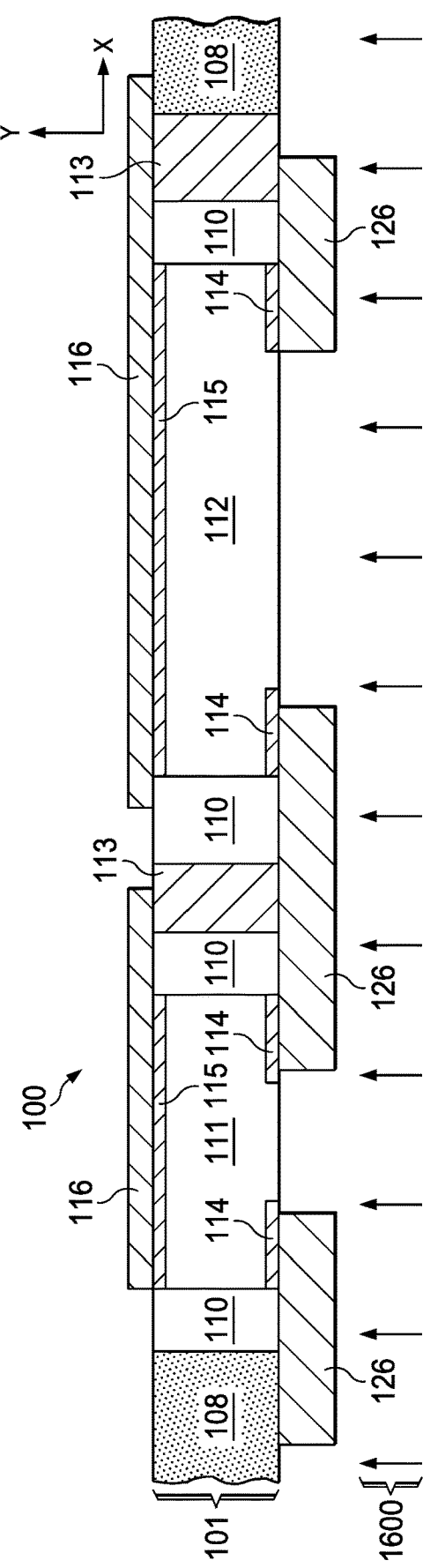

At 228 in FIG. 2, the method 200 continues with removal of the resist 1402 and underlying seed layer material 1302 from the bottom side 103 of the embedded die structure 101. FIG. 16 shows one example, in which a stripping process 1600 is performed that strips or otherwise removes the remaining resist material, along with underlying remnant portions of the seed layer. The process 1600 leaves the plated copper structures 126 that extend on or over select portions of the second side 103 of the embedded die structure 101.

Figure 17:
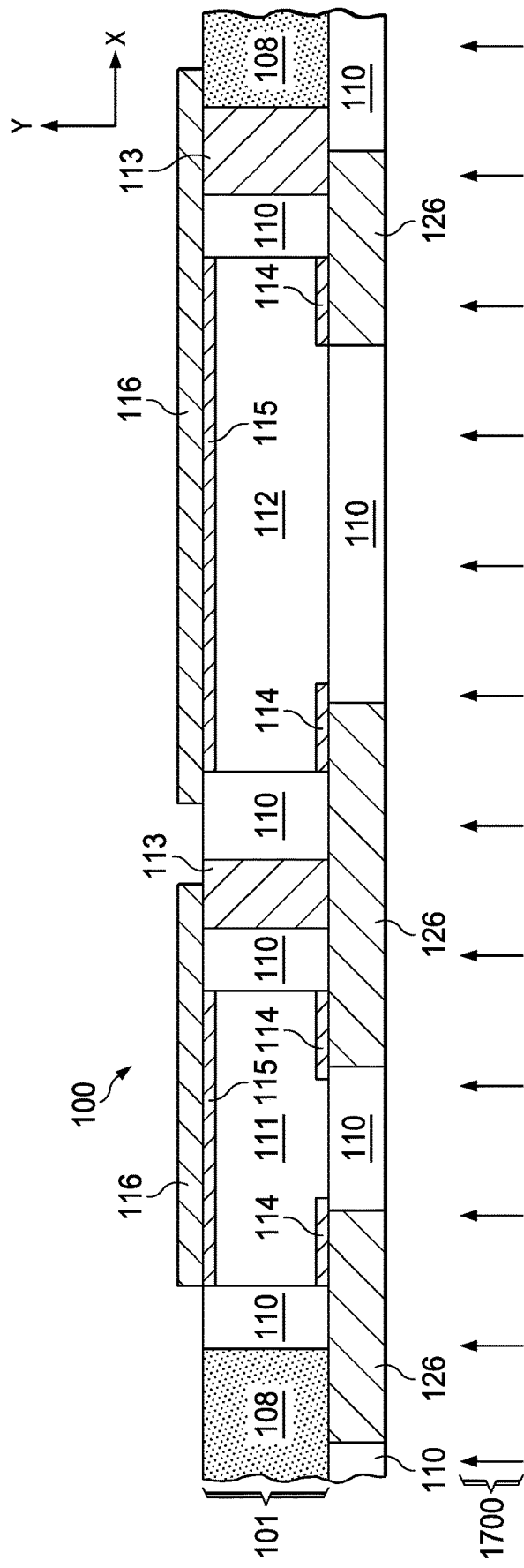

At 230 in FIG. 2, the method 200 further includes forming build-up material as a lamination structure in the gaps between the copper structures on the bottom side of the embedded die structure 101. FIG. 17 shows one example, in which a lamination process 1700 is performed that forms the lamination structure 110 in the gaps between the copper structures 126 on the second side 103 of the embedded die structure 101. As described above at 206 in FIG. 2, the build-up material used in one example at 230 is initially in the form of one or more sheets, and the process 1700 includes pressing or otherwise installing one or more sheets of the material into the gaps between the copper structures 126. FIG. 17 shows the packaged electronic device 100 with a single RDL structure layer.

Figure 18:
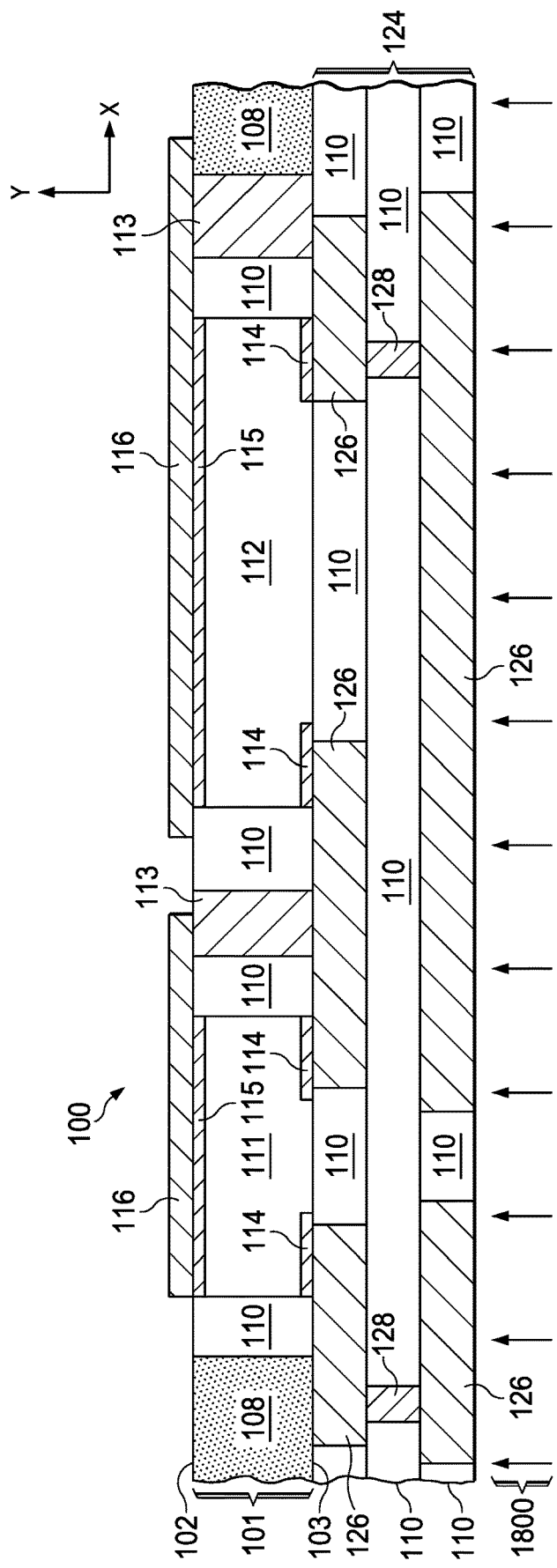

FIG. 18 shows the example device 100 after further processing 1800 that includes repeating the processing at 222 form two additional RDL layers. In this example, the device 100 includes a three-layer RDL structure 124, with the second and final layers being fabricated beneath the first layer in succession by repeating the processing described above in connection with 222, 224, 226, 228 and 230 in FIG. 2. The RDL structure 124 includes conductive structures (e.g., metal lines 126 and metal vias 128) that electrically connect the final (e.g., bottom) RDL layer to at least some of the contact structures 114 of the semiconductor dies 111 and 112.

Figure 19:
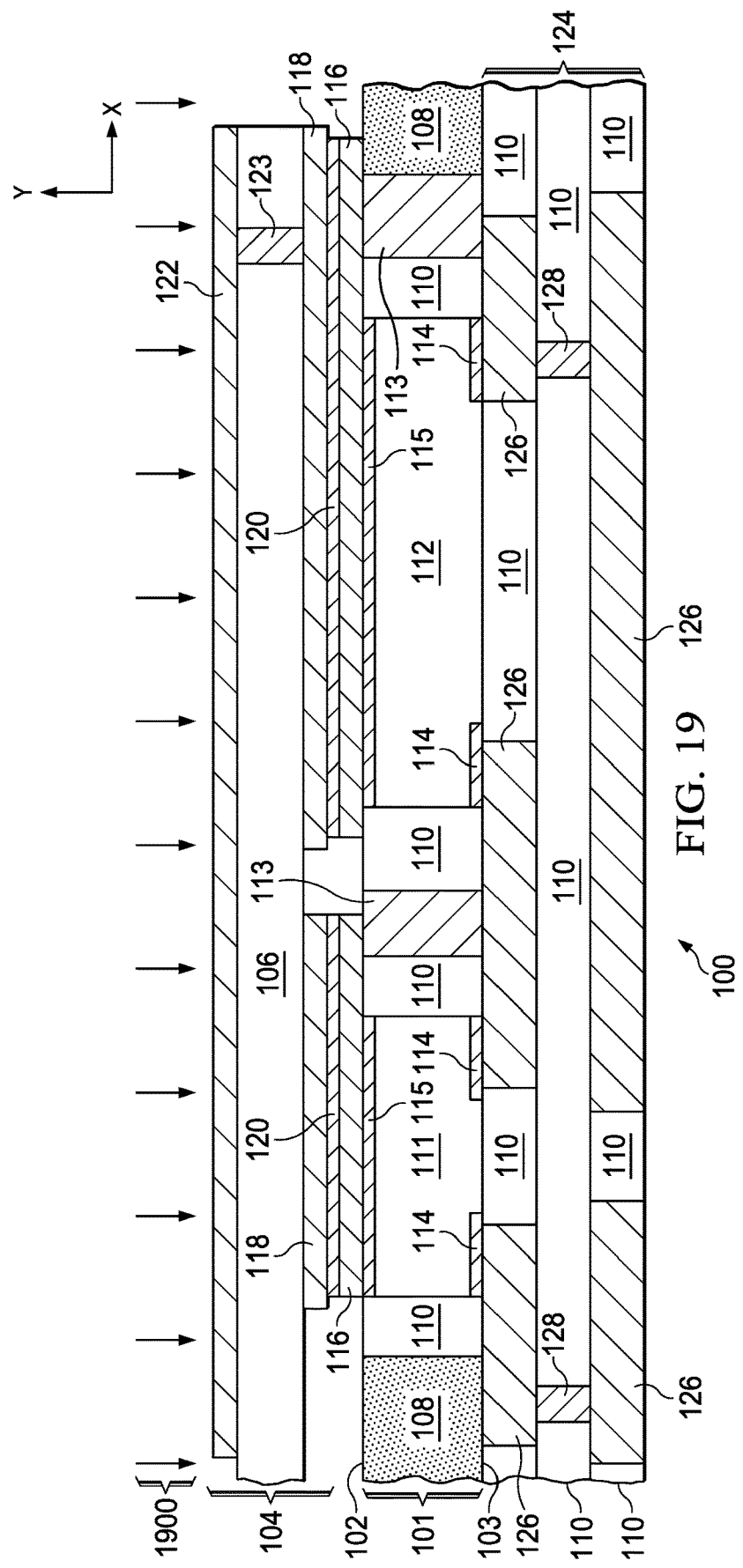

The method 200 continues at 232, including attaching a ceramic substrate to the semiconductor dies on the first (e.g., top) side 102 of the embedded die structure 101. FIG. 19 shows one example, in which an attachment process 1900 is performed that attaches the ceramic substrate 106 to the semiconductor dies 111, 112. In one example, the attachment process 1900 is a reflow soldering process that solders the first conductive layer 118 of the first side of the ceramic substrate 106 to the contact structures 115 of the semiconductor dies 111, 112 or to the intervening patterned copper structures 116 on the first side 102 of the embedded die structure 101. In another example, the attachment process at 232 includes epoxying a first side of the ceramic substrate to the semiconductor dies or associated features on the first side 102 of the embedded die structure 101. In a further example, the attachment process at 232 includes centering all over portions of the lower side of the ceramic substrate 106 (or associated layer formed thereon) to the first side 102 of the embedded die structure 101 (or an associated layer formed thereon).

Figure 20:
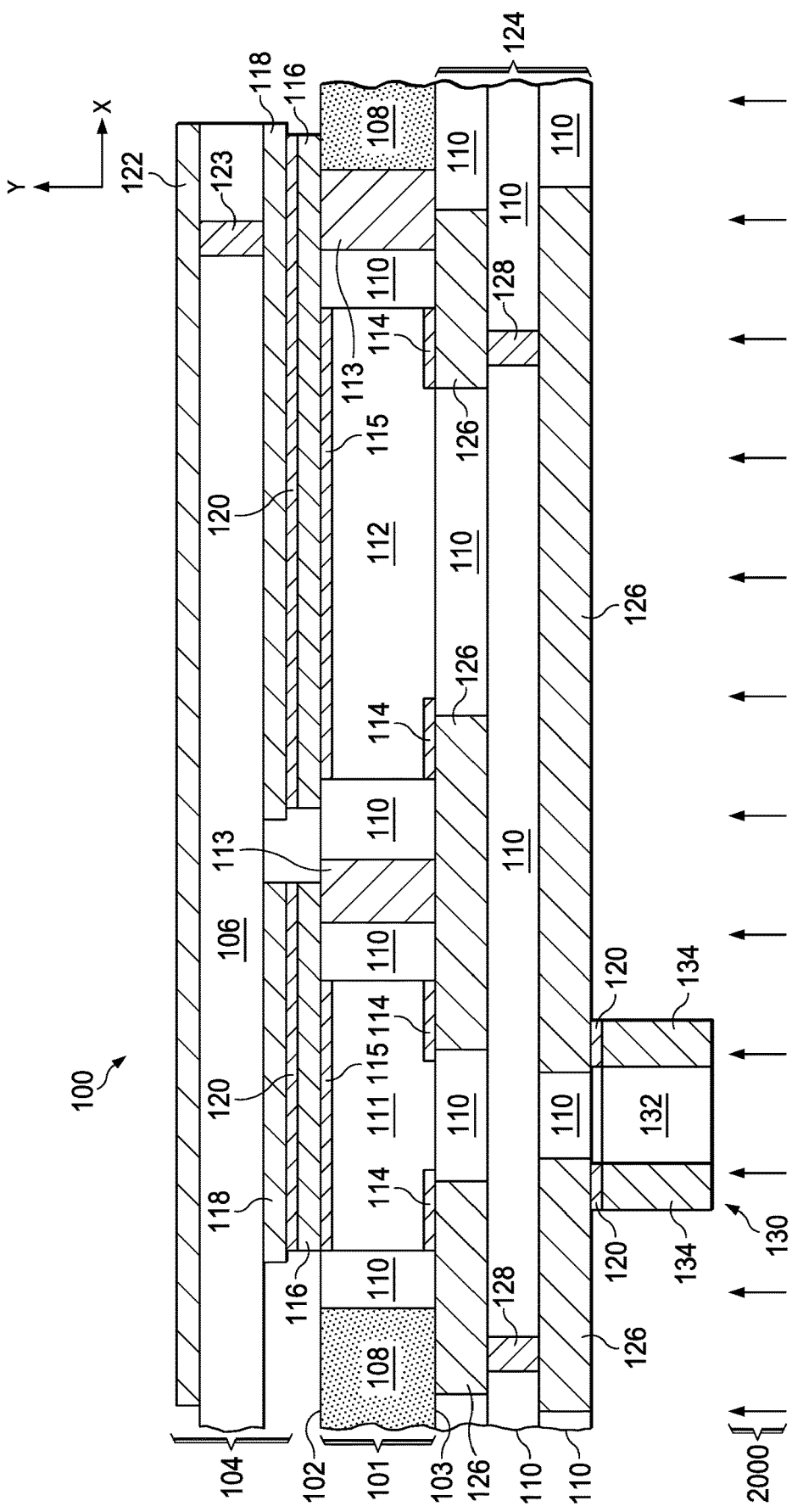

The method 200 continues at 234, including attaching one or more passive components to the RDL structure. FIG. 20 shows one example, in which a soldering process 2000 is performed that solders the above-described capacitor component 132 the conductive structures 126 in the final (e.g., bottom) RDL layer using solder material 120.

Figure 21:
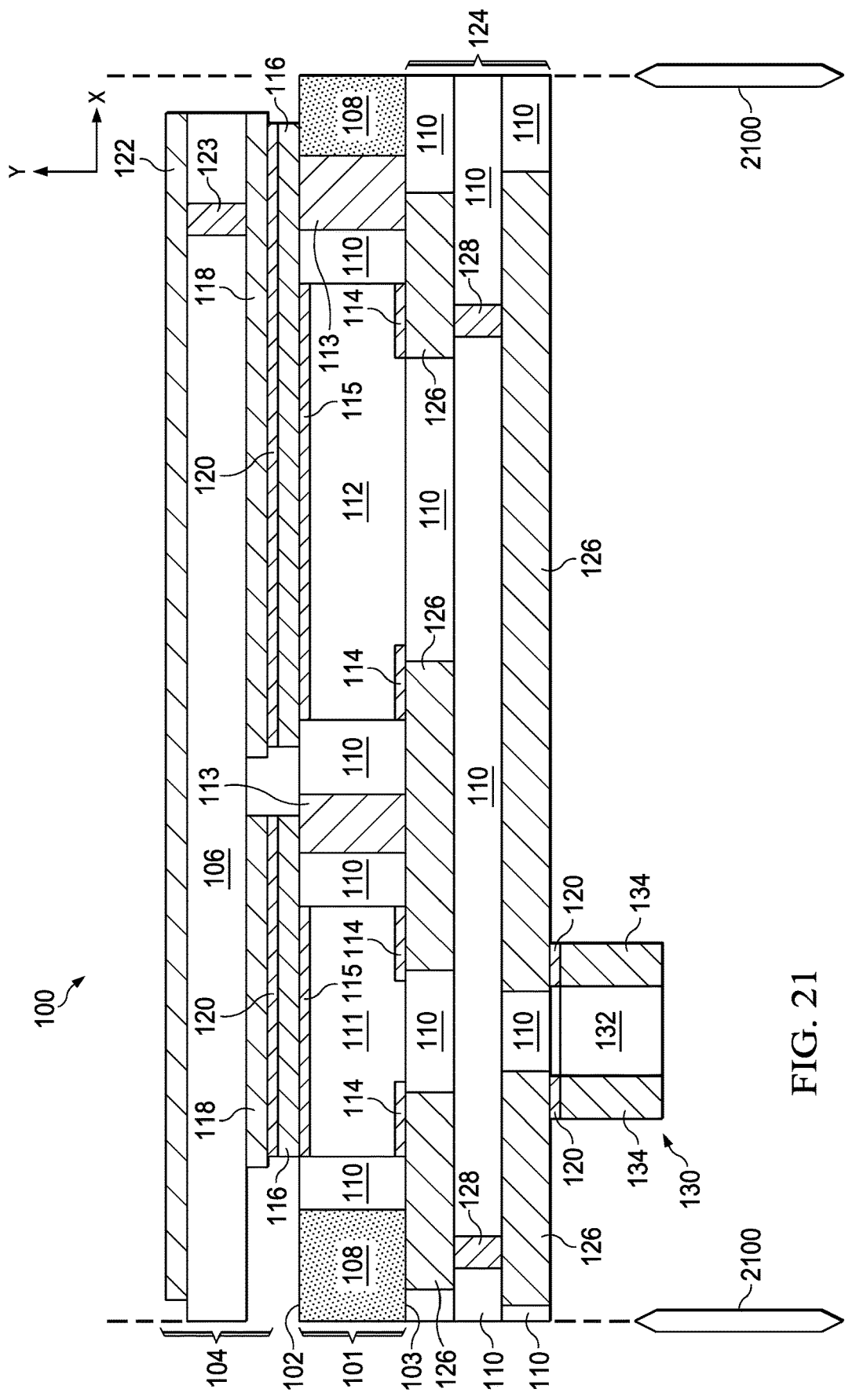

At 236 in FIG. 12, the method 200 also includes separating individual packaged electronic devices from the panel structure used during the above-described processing. FIG. 21 shows one example, in which a singulation process 2100 is performed, such as a saw cutting process, a laser cutting process, an etching process, etc. The above process 200 provides packets semiconductor devices with ceramic insulation to facilitate high voltage withstand performance with reduced creepage distances and improved thermal performance. In the illustrated example device 100, the power loop return path is minimized to provide low inductance and improved electrical performance, for example, in switching power supply circuit applications. The disclosed example s provide specific advantages in compact designs that utilize high voltage switching devices, such as GaN and/or SiC power switching devices for power supplies circuitry or other circuits that benefit from high-voltage operation, low loop inductance and reduced creepage distances. In addition, the disclosed concepts provide fabrication cost advantages through integration into panel processing fabrication flows.

FIG. 22 shows further details of an example semiconductor die 111, 112 in the packaged microelectronic device 100 of FIG. 1. The example die 111, 112 of FIG. 22 includes multiple electronic components 2201 (e.g., metal oxide semiconductor (MOS) transistors) disposed on or in a semiconductor substrate 2202. Although the example die 111, 112 is an integrated circuit with multiple components 2201, other microelectronic device implementations can include a single electronic component. In one example, the individual dies 111 and 112 include a single transistor, such as a GaN or SiC transistor. The semiconductor substrate 2202 in one example is a silicon wafer, a silicon-on-insulator (SOI) substrate or other semiconductor structure. Isolation structures 2203 are disposed on select portions of an upper surface or side of the substrate 2202. The isolation structures 2203 can be shallow trench isolation (STI) features or field oxide (FOX) structures in some examples. The example die 111, 112 also includes a multi-layer metallization structure 2204, 2206 disposed above the substrate 2202. The metallization structure includes a first dielectric structure layer 2204 formed over the substrate 2202, as well as a multi-level upper metallization structure 2206. In one example, the first dielectric 2204 structure layer is a pre-metal dielectric (PMD) layer disposed over the components 2201 and the upper surface of the substrate 2202. In one example, the first dielectric structure layer 2204 includes silicon dioxide ($SiO_2$) deposited over the components 2201, the substrate 2202 and the isolation structures 2203.

The example die 111, 112 of FIG. 22 includes a 6 layer upper metallization structure 2206 with a first layer 2208, referred to herein as an interlayer or interlevel dielectric (ILD) layer. Different numbers of layers can be used in different implementations. In one example, the first ILD layer 2208, and the other ILD layers of the upper metallization structure 2206 are formed of silicon dioxide ($SiO_2$) or other suitable dielectric material. In certain implementations, the individual layers of the multi-layer upper metallization structure 2206 are formed in two stages, including an intra-metal dielectric (IMD, not shown) sub layer and an ILD sublayer overlying the IMD sub layer. The individual IMD and ILD sublayers can be formed of any suitable dielectric material or materials, such as $SiO_2$-based dielectric materials. Tungsten or other conductive contacts 2210 extend through selective portions of the first dielectric structure layer 2204.

The first ILD layer 2208, and the subsequent ILD layers in the upper metallization structure 2206 include conductive metallization interconnect structures 2212, such as aluminum formed on the top surface of the underlying layer. In this example, the first layer 2208 and the subsequent ILD layers also include conductive vias 2213, such as tungsten, providing electrical connection from the metallization features 2212 of an individual layer to an overlying metallization layer. The example of FIG. 22 includes a second layer 2214 disposed over the first layer 2208. The ILD layer 2208 includes conductive interconnect structures (e.g., lines) 2212 and vias 2213. The illustrated structure includes further metallization levels with corresponding dielectric layers 2215, 2216 and 2217, as well as an uppermost or top metallization layer 2218. The individual layers 2215-2218 in this example include conductive interconnect structures 2212 and associated vias 2213. The substrate 2202, the electronic components 2201, the first dielectric structure layer 2204 and the upper metallization structure 2206 form a die 111, 112 with an upper side or surface 2221. The upper side 2221 of the metallization structure 2206 in one example forms an upper side of the die 111, 112.

The top metallization layer 2218 includes two example conductive features 2219, such as upper most aluminum vias. The conductive features 2219 include a side or surface at the upper side 2221 of the die 111, 112 at the top of the uppermost metallization layer 2218. Any number of conductive features 2219 may be provided. One or more of the conductive features 2219 can be electrically coupled with an electronic component 2201. The upper ILD dielectric layer 2218 in one example is covered by one or more passivation layers 2223 (e.g., protective overcoat (PO) and/or passivation layers), for example, silicon nitride (SiN), silicon oxynitride ($SiO_xN_y$), or silicon dioxide ($SiO_2$). In one example, the passivation layer or layers 2223 include one or more openings that expose a portion of the conductive features 2219 to allow electrical connection of the features 2219 to corresponding contact structures.

In the example of FIG. 22, the die 111, 112 includes two conductive contact structures 114 (also shown in FIG. 1). The contact structures 114 extend outward (e.g., upward along the "Y" direction in FIG. 22) from the upper side 2221 of the metallization structure 2206. The individual contact structures 114 are electrically coupled with a corresponding one of the conductive features 2219. The individual contact structures 114 in one example include a conductive seed layer, such as copper that extends outward from the upper side 2221 of the metallization structure 2206. In one example, the contact structure 114 includes titanium (Ti) or titanium tungsten (TiW). The example die 111, 112 in FIG. 2 also includes a bottom conductive feature 115 (also shown in FIG. 1).

Figure 23:
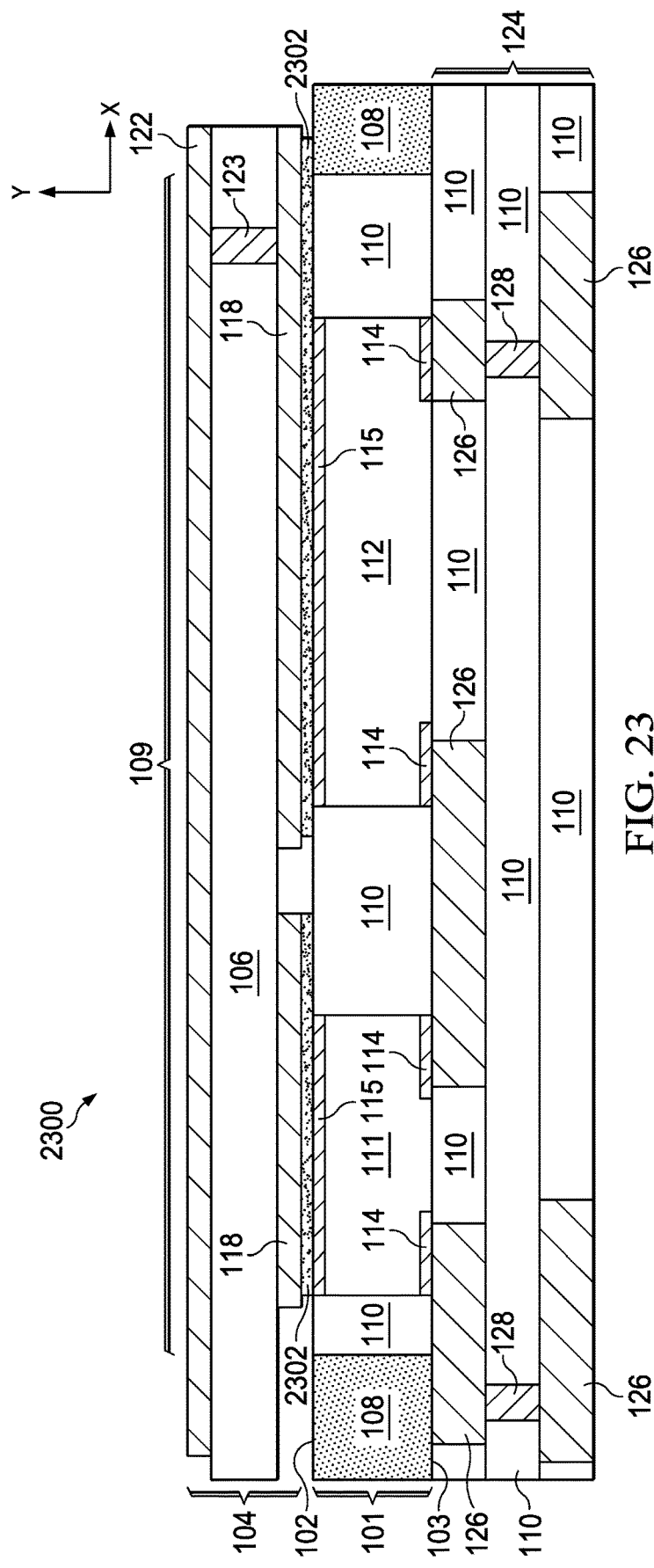
FIG. 23 is a partial sectional side elevation view of another example packaged electronic device with a ceramic substrate and semiconductor dies embedded in an organic frame structure.

FIG. 23 shows another example packaged electronic device 2300 with a ceramic substrate 106 and semiconductor dies 111 and 112 embedded in an organic frame structure 108 as described above in connection with FIG. 1. In this example, the device 2300 includes a three-layer RDL structure 124 as generally described above, and the ceramic isolation structure 104 includes top and bottom conductive features 122 and 118, respectively, similar to the device 100 in FIG. 1. In this example, however, centering or epoxy 2302 is used to attach the bottom side of the ceramic isolation structure 104 to the first or top side 102 of the embedded die structure 101.

Modifications are possible in the described embodiments, and other embodiments are possible, within the scope of the claims.

The invention claimed is:
1. A method for fabricating a packaged electronic device, the method comprising:
attaching an organic panel frame to an adhesive carrier structure;
attaching a plurality of semiconductor dies to the adhesive carrier structure in openings of the organic panel frame;

forming a lamination structure in gaps between the organic panel frame and the semiconductor dies;
removing the adhesive carrier structure;
forming a redistribution layer (RDL) structure with a conductive structure electrically connected to contact structures of the semiconductor dies;
attaching a ceramic substrate to the semiconductor dies; and
separating a packaged electronic device from the panel.

2. The method of claim 1, wherein attaching the ceramic substrate to the semiconductor dies includes soldering a first conductive layer on a first side of the ceramic substrate to further contact structures of the semiconductor dies.

3. The method of claim 1, wherein attaching the ceramic substrate to the semiconductor dies includes epoxying a first side of the ceramic substrate to the semiconductor dies.

4. The method of claim 1, wherein attaching the ceramic substrate to the semiconductor dies includes sintering a first side of the ceramic substrate to the semiconductor dies.

5. The method of claim 1, further comprising attaching a passive component attached to the RDL structure and electrically connecting the passive component to the conductive structure of the RDL structure.

6. The method of claim 1,
wherein the packaged electronic device includes a circuit formed by first and second transistor components of at least one of the semiconductor dies;
wherein the RDL structure includes a conductive structure in a return path of the circuit.

7. The method of claim 6, further comprising providing a second semiconductor die.

8. The method of claim 6, wherein the ceramic substrate includes:
a first side with a first conductive layer soldered to the first side of at least one of the semiconductor dies;
a second side with a second conductive layer; and
a conductive via that extends through the ceramic substrate from the first side to the second side to electrically connect the first conductive layer to the second conductive layer.

9. The method of claim 8, wherein the conductive via, the first conductive layer, and the second conductive layer of the ceramic substrate are in the return path of the circuit.

10. The method of claim 1, wherein the ceramic substrate includes:
a first side with a first conductive layer soldered to at least one of the semiconductor dies;
a second side with a second conductive layer; and
a conductive via that extends through the ceramic substrate from the first side to the second side to electrically connect the first conductive layer to the second conductive layer.

11. A method for fabricating a packaged electronic device, the method comprising:
placing a semiconductor die in an opening in an organic panel frame;
forming a lamination structure in gaps between the organic panel frame and the semiconductor die;
forming a redistribution layer (RDL) structure with a conductive structure electrically connected to contact structures of the semiconductor die; and
attaching a ceramic substrate to the semiconductor die.

12. The method of claim 11, further comprising connecting a conductive structure of a redistribution layer (RDL) structure to the contact structure of the semiconductor die.

13. The method of claim 12, wherein the RDL structure is a multi-layer structure that includes:
a first layer, including the conductive structure electrically connected to the contact structure of the semiconductor die;
a final layer, including a further conductive structure electrically connected to the contact structure of the semiconductor die.

14. The method of claim 13, further comprising attaching a passive component to the final layer of the RDL structure and electrically connecting the passive component to the further conductive structure of the final layer of the RDL structure.

15. The method of claim 11, further comprising attaching a passive component attached to the RDL structure and electrically connecting the passive component to the conductive structure of the RDL structure.

16. The method of claim 15,
wherein the packaged electronic device includes a circuit formed by first and second transistor components of the semiconductor die;
wherein the RDL structure includes a conductive structure in a return path of the circuit.

17. The method of claim 16, further comprising providing a second semiconductor die.

18. The method of claim 17, wherein the ceramic substrate includes:
a first side with a first conductive layer soldered to a first side of an embedded die structure;
a second side with a second conductive layer; and
a conductive via that extends through the ceramic substrate from the first side to the second side to electrically connect the first conductive layer to the second conductive layer.

19. The method of claim 18, wherein the conductive via, the first conductive layer, and the second conductive layer of the ceramic substrate are in the return path of the circuit.

20. The method of claim 11, wherein the ceramic substrate includes:
a first side with a first conductive layer soldered to the first side of the semiconductor die;
a second side with a second conductive layer; and
a conductive via that extends through the ceramic substrate from the first side to the second side to electrically connect the first conductive layer to the second conductive layer.

* * * * *